United States Patent
Choi et al.

(10) Patent No.: US 9,006,037 B2
(45) Date of Patent: Apr. 14, 2015

(54) METHODS OF FORMING BUMP AND SEMICONDUCTOR DEVICE WITH THE SAME

(71) Applicant: Electronics and Telecommunications Research Institute, Daejeon (KR)

(72) Inventors: Kwang-Seong Choi, Daejeon (KR); Yong Sung Eom, Daejeon (KR); Hyun-cheol Bae, Daejeon (KR); Haksun Lee, Seoul (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/904,572

(22) Filed: May 29, 2013

(65) Prior Publication Data

US 2014/0287556 A1     Sep. 25, 2014

(30) Foreign Application Priority Data

Mar. 20, 2013 (KR) ........................ 10-2013-0029771

(51) Int. Cl.
*H01L 21/00* (2006.01)
*H01L 23/00* (2006.01)

(52) U.S. Cl.
CPC ...................... *H01L 24/11* (2013.01)

(58) Field of Classification Search
CPC .. B23K 35/325; B23K 35/3613; B23K 35/24; H05K 3/3484; H05K 13/0465; H05K 13/0469; H05K 3/323
See application file for complete search history.

(56) References Cited

U.S. PATENT DOCUMENTS

| | | | |
|---|---|---|---|
| 6,656,291 B1 | 12/2003 | Ueda | |
| 7,626,202 B2 | 12/2009 | Yamazaki | |
| 7,662,708 B2 | 2/2010 | Fork et al. | |
| 8,420,722 B2 * | 4/2013 | Eom et al. | 524/261 |
| 2010/0006625 A1 * | 1/2010 | Eom et al. | 228/164 |

FOREIGN PATENT DOCUMENTS

| | | |
|---|---|---|
| KR | 10-0606179 B1 | 7/2006 |
| KR | 10-1175682 B1 | 8/2012 |

OTHER PUBLICATIONS

Bae et al. ('3D SiP Module Using TSV and Novel Solder Bump Maker'—2010), 2010 Electronic Components and Technology Conference, Pags 1637-1641.*
Seung-Ho Kim et al., "High Productivity and Damage-free Ultrasonic Anisotropic Conductive Film (ACF) Bonding for Touch Screen Panel (TSP) Assemblies", Electronic Components and Technology Conference (ECTC), 2012 IEEE 62$^{nd}$, May 29, 2012-Jun. 1, 2012, pp. 1770-1773.

* cited by examiner

*Primary Examiner* — Reema Patel
*Assistant Examiner* — Syed Gheyas
(74) *Attorney, Agent, or Firm* — Rabin & Berdo, P.C.

(57) ABSTRACT

Provided are methods of forming a bump and a semiconductor device with the same. The method may include providing a substrate with pads, forming a bump maker layer to cover the pads and include a resin and solder particles, thermally treating the bump maker layer to aggregate the solder particles onto the pads, removing the resin to expose the aggregated solder particles, forming a resin layer to cover the aggregated solder particles, and reflowing the aggregated solder particles to form bumps on the pads.

14 Claims, 7 Drawing Sheets

METHODS OF FORMING BUMP AND SEMICONDUCTOR DEVICE WITH THE SAME

CROSS-REFERENCE TO RELATED APPLICATIONS

This U.S. non-provisional patent application claims priority under 35 U.S.C. §119 to Korean Patent Application No. 10-2013-0029771, filed on Mar. 20, 2013, in the Korean Intellectual Property Office, the entire contents of which are hereby incorporated by reference.

BACKGROUND OF THE INVENTION

Example embodiments of the inventive concept relate to methods of forming a bump and a semiconductor device with the same, and in particular, to a method of forming a bump on a package substrate.

As a consequence of the use of high-density semiconductor chips in electronic devices, there is a drastically increasing demand for a technology capable of realizing a semiconductor chip with many pins and a small pitch. For example, a flip-chip technology may be used to mount a small-sized package on a printed circuit board (PCB).

The flip-chip process may include steps of providing an anisotropic conductive film, which includes conductive particles distributed in an insulating adhesive material, between objects to be attached, and then, heating and pressing the resulting structure with the anisotropic conductive film. However, in the case where the conductive pattern is fine, the process suffers from occurrence of electric short circuit. Further, in the pressing process, the package play be damaged by high pressure applied thereto. Especially, if the package includes a glass substrate, it is likely to be broken during pressing process.

SUMMARY

Example embodiments of the inventive concept provide a method of forming a semiconductor device with improved reliability.

Other example embodiments of the inventive concept provide a method of forming a semiconductor device with fine pitch patterns.

According to example embodiments of the inventive concepts, a method of forming a semiconductor device may include providing a package substrate with pads, forming a solder bump maker layer on the package substrate, the solder bump maker layer covering the pads and including a resin and solder particles, reflowing the solder particles to form bumps on the pads, and connecting the bump to a device substrate to couple the package substrate electrically to the device substrate.

In example embodiments, the reflowing of the solder particles may include thermally treating the solder bump maker layer to aggregate the solder particles adjacent to the pad onto the pad, removing the resin to expose the aggregated solder particles, forming a resin layer to cover the solder particles, thermally treating the solder particles to form the bumps on the pads, and removing the resin layer to expose the bumps.

In example embodiments, the thermally treating of the solder bump maker layer may be performed at a temperature that is equivalent to or lower than a melting point of the solder particles.

In example embodiments, the reflowing of the solder particles may include a thermal treatment performed at a temperature that may be higher than a melting point of the solder particles and lower than a curing temperature of the resin.

In example embodiments, the forming of the solder bump maker layer may include forming a g side layer on the package substrate to expose the pads, coating a solder bump maker on the exposed pad to form the solder bump maker layer, thinning the solder bump make layer, and removing the guide layer.

In example embodiments, the forming of the solder bump maker layer may include attaching a film including the resin and the solder particles on the package substrate.

In example embodiments, the reflowing of the solder particles may include removing the solder bump maker layer to expose the bumps.

According to example embodiments of the inventive concepts, a method of forming a bump may include providing a substrate with pads, forming a bump maker layer on the substrate to cover the pads and include a resin and solder particles, performing a first thermal treatment to the bump maker layer to aggregate the solder particles on the pads, removing the resin to expose the aggregated solder particles, forming a resin layer to cover the aggregated solder particles, and performing a second thermal treatment to the bump maker layer to form bumps on the pads.

In example embodiments, the first thermal treatment of the bump maker layer may be performed at a temperature that is lower than a melting point of the solder particle.

In example embodiments, the second thermal treatment of the bump maker layer may include reflowing the solder particles at a temperature that is higher than a melting point of the solder particle and lower than a curing temperature of the resin.

In example embodiments, the forming of the bump maker layer may include attaching a film-shaped solder bump maker material on the substrate.

In example embodiments, the forming of the bump maker layer may include coating the substrate with a paste-like solder bump maker material.

In example embodiments, the forming of the bump maker layer may include preparing a solder bump maker material that is formed by adding the solder particles into the resin under nitrogen ambient.

In example embodiments, the resin may further include a reductant.

In example embodiments, the solder particles may be formed to have a mean diameter ranging from $1/10000$ to $1/3$ of that of the pads.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
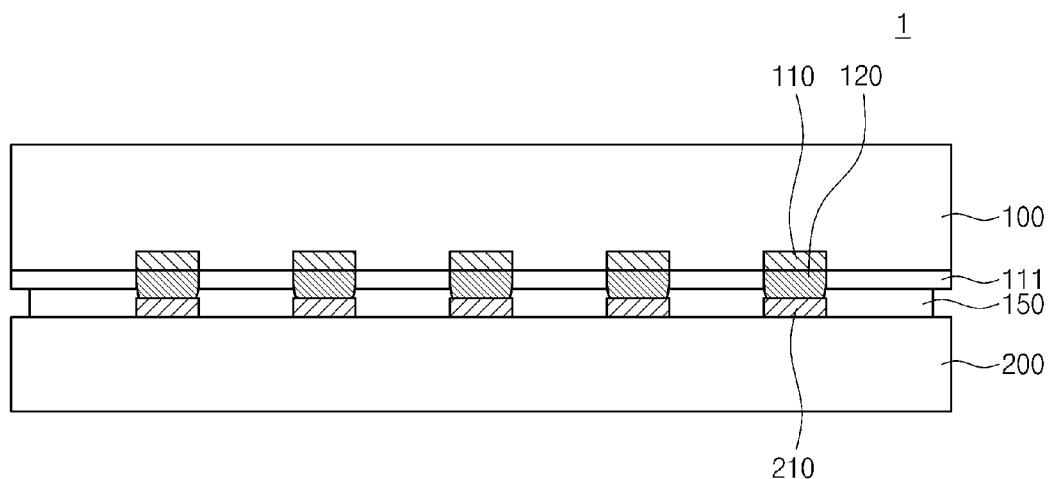
FIG. 1 is a sectional view illustrating a semiconductor device according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

A semiconductor device according to example embodiments of the inventive concept will be described with reference to FIG. 1.

FIG. 1 is a sectional view illustrating a semiconductor device according to example embodiments of the inventive concept.

Referring to FIG. 1, a semiconductor device 1 may include a package substrate 100, a device substrate 200, and bumps 120 provided between the package substrate 100 and the device substrate 200 to connect them electrically with each other. The semiconductor device 1 may be provided in the form of a flip-chip package, in which the device substrate 200 is mounted on the package substrate 100 in a face-down manner. An under-filling layer 150 may be provided to cover the device substrate 200 and fill a gap between the device substrate 200 and the package substrate 100. The under-filling layer 150 may be interposed between the bumps 120.

The package substrate 100 may be a printed circuit board (PCB) or a flexible printed circuit board (FPCB). The package substrate 100 may further include substrate pads 110 and the bumps 120. The substrate pads 110 may be provided on the package substrate 100 to connect the package substrate 100 electrically to the bumps 120. A passivation pattern 111 may be provided on the package substrate 100 to expose the substrate pads 110. The passivation pattern 111 may include a photoresist material. In other example embodiments, the passivation pattern 111 may be omitted. The bumps 120 may be provided on the substrate pads 110 and they may be provided in the form of solder ball. The bumps 120 may include at least one of conductive materials, such tin (Sn) and indium (In). An under-bump metal layer (not shown) may be further provided between the substrate pads 110 and the bumps 120.

The device substrate 200 may be a printed circuit board or a display panel. A pad 210 may include a conductive material and connect the device substrate 200 electrically to the bumps 120.

The semiconductor device 1 may be configured not to have a bridge (not shown) between the bumps 120. The semiconductor device 1 may be formed to have a smaller pattern pitch, compared with the case with the bridge. Further, it is possible to prevent electrical short from occurring between the bumps 120.

Hereinafter, methods of forming a bump, according to example embodiments of the inventive concept, will be described with reference to FIGS. 2 through 11.

Figure 2:
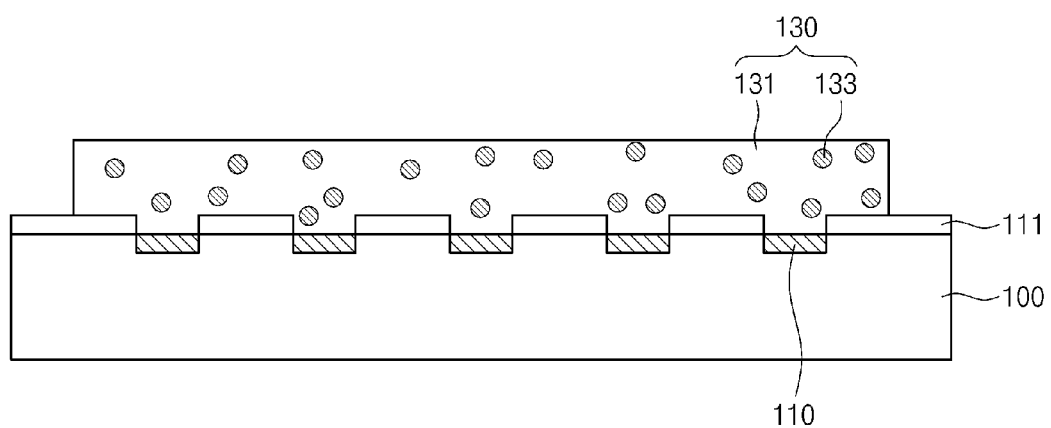
FIGS. 2 through 4 are sectional views illustrating a method of forming a bump, according to example embodiments of the inventive concept.
Figure 3:
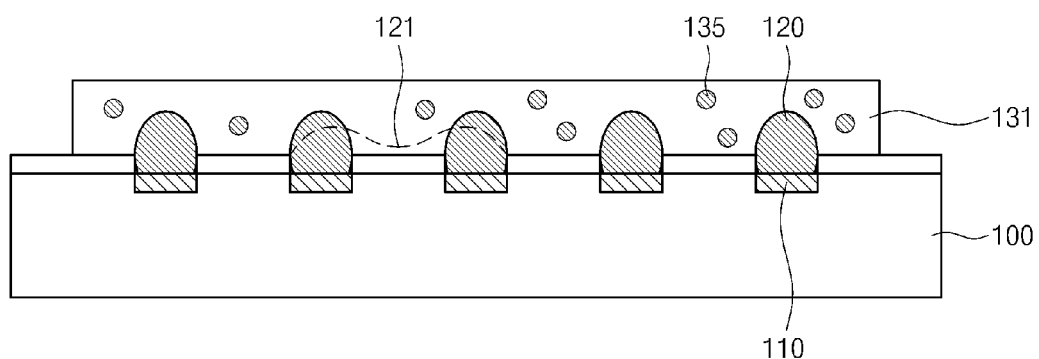
Figure 4:
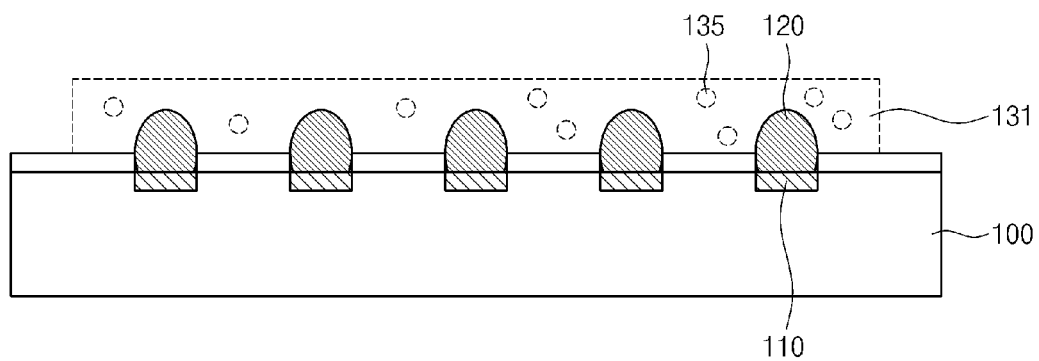

FIGS. 2 through 4 are sectional views illustrating a method of forming a bump, according to example embodiments of the inventive concept. In the description that follows, a discussion of features identical to those of FIG. 1 will be minimized in order to avoid redundancy.

Referring to FIG. 2, the package substrate 100 with the passivation pattern 111 and the substrate pads 110 may be provided. The package substrate 100 may be provided in the form of the printed circuit board, as described with reference to FIG. 1. The passivation pattern 111 may be provided between the substrate pads 110 to cover the package substrate 100. In other words, the passivation pattern 111 may be omitted. A solder bump maker layer 130 (hereinafter, SBM layer) may be formed on the package substrate 100 to cover the exposed substrate pads 110. In example embodiments, the SBM layer 130 may be formed by attaching a film-shaped solder bump maker material on the package substrate 110.

A solder bump maker and a forming method thereof will be described in more detail below. The solder bump maker may contain a resin 131 and solder particles 133. For example, the resin 131 may be a thermosetting resin, such as glycidyl ether of bisphenol-A, DiGlycidyl Ether of Bisphenol-A (DGEBA), Tri-Glycidyl p-Aminophenol (TGAP), TetraGlycidyl Diamine Diphenyl Methane (TGDDM), isocyanate, and/or bismaleimide resin. In other example embodiments, the resin 131 may contain silicon-based resins or non-halogen type resins. The resin 131 may further contain a reductant. The reductant may be a material containing carboxylic group (—COOH). For example, the reductant may include at least one of glutaric acid, malic acid, azelaic acid, abietic acid, adipic acid, ascorbic acid, acrylic acid, and/or citric acid. The reductant may be contained in the resin 131, in such a way that its part-by-weight is about 1 to 50 phr (per hundred resin) with respect to the resin 131. In the resin 131, the solder particles 133 may be distributed in the form of powder. Each of the solder particles 133 may be shaped like a plate, a sphere, or a sphere with protrusions. The solder particles 133 may include at least one of tin (Sn) or indium (In). For example, the solder particles 133 may include at least one of SnBi, SnAgCu, SnAg, AuSn, or InSn. The solder particles 133 may be contained in the solder bump maker to have a volume ratio of 1-50% with respect to the total volume of the solder bump maker. A mean diameter of the solder particles 133 may range from 1/10000 to 1/3 (e.g., 1/5 or less) of that of the substrate pads 110. In example embodiments, in the case where the substrate pads 110 have a mean diameter of 10 μm or less, the solder particles 133 may have a mean diameter of 2 μm or less. In the case where the substrate pads 110 are scaled down, the solder particles 133 may also be scaled down. In this case, there may be a difficulty in removing the oxide layer from the surfaces of the solder particles 133. According to example embodiments of the inventive concept, the solder bump maker may be formed by adding the solder particles 133 into the resin 131 under nitrogen ambient. This makes it possible to prevent the oxide layer from being formed on the surfaces of the solder particles 133.

Referring to FIG. 3 in conjunction with FIG. 2, the solder particles 133 in the SBM layer 130 may be reflowed to form the bumps 120 on the substrate pads 110. Each of the bumps 120 may be formed to have a shape of a solder ball. If the solder particles 133 are reflowed, the solder particles 133 may be aggregated on the substrate pads 110 to form the bumps 120. Here, the reductant in the resin 131 may contribute to remove an oxide layer which may be formed on the solder particles 133 and the substrate pads 110. The reflow process of the solder particles 133 may be performed at a temperature that is higher than a melting point of the solder particles 133 and lower than a curing temperature of the resin 131. Here, some of the solder particles in the resin 131 may not be participated in the forming process of the bumps 120, thereby forming remaining solder particles 135.

As depicted by a dotted of FIG. 3, when the resin 131 is cured, the remaining solder particles 135 may be aggregated between the substrate pads 110 to form a bridge 121. In the reflow process, the resin 131 may not be cured to exhibit a fluidic property. Accordingly, the remaining solder particles 135 may not be easily aggregated to each other, and thus, it is possible to prevent he bridge 121 from being formed between the substrate pads 110.

Referring to FIG. 4, the remaining solder particles 135 and the resin 131 may be removed. The removal of the remaining solder particles 135 and the resin 131 may be performed using a cleaning process. As a result, the formation of the bumps 120 may be finished.

Figure 5:
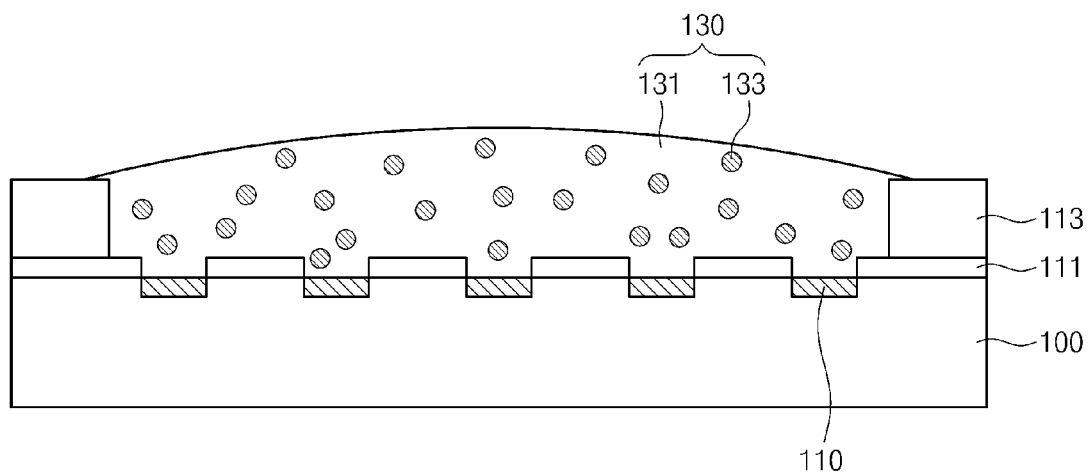
FIGS. 5 through 7 are sectional views illustrating a method of forming a bump, according to other example embodiments of the inventive concept.
Figure 6:
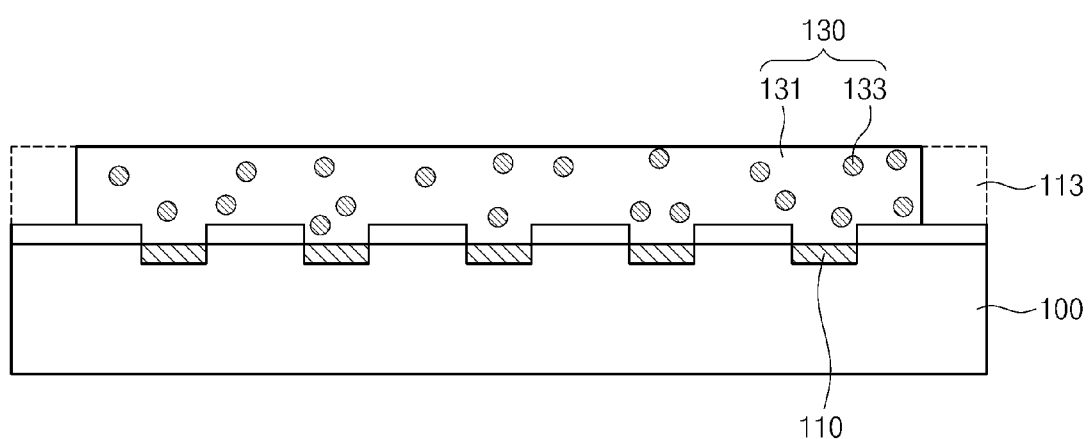
Figure 7:
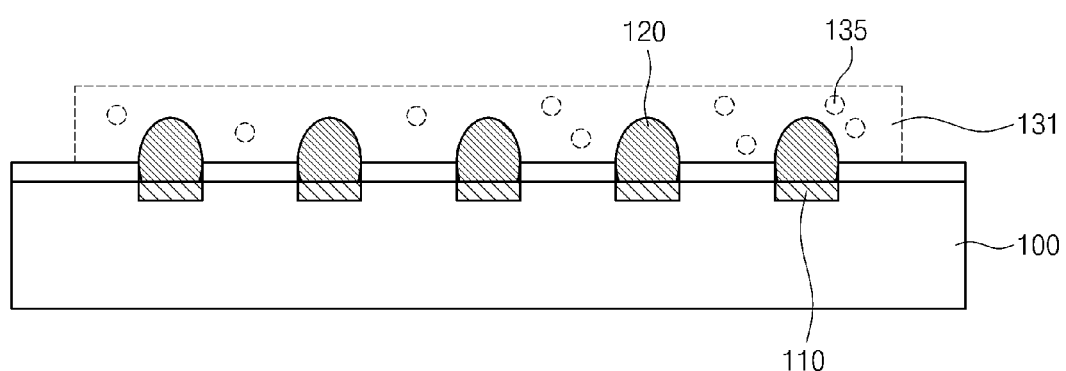

FIGS. 5 through 7 are sectional views illustrating a method of forming a bump, according to other example embodiments of the inventive concept. For the sake of brevity, again, the elements and features of this example that are similar to those previously shown and described will not be described in much further detail.

Referring to FIG. 5, the package substrate 100 with the passivation pattern 111 and the substrate pads 110 may be provided. The package substrate 100 may be provided in the form of a printed circuit board, as described with reference to FIG. 1. A guide 113 exposing the substrate pads 110 may be formed on the passivation pattern 111. The SBM layer 130 may be formed to cover the substrate pads 110 exposed by the guide 113. The SBM layer 130 may have a top surface that is higher than that of the guide 113. The guide 113 and the SBM layer 130 may include at least one of the solder bump maker materials described with reference to FIG. 2. The SBM layer 130 may be formed by screen-printing a paste-like solder bump maker on the package substrate 100.

Referring to FIG. 6, the SBM layer 130 may be thinned, and thus, the SBM layer 130 may have the same height as the guide 113. Here, the SBM layer 130 may be planarized. The height of the SBM layer 130 may be controlled by a blade technique. Thereafter, the guide 113 may be removed.

Referring to FIG. 7, solder particles 133 in the SBM layer 130 may be reflowed to form the bumps 120 on the substrate pads 110. The reflow process of the solder particles 133 may be performed in the same or similar manner as that described with reference to FIG. 3. The remaining solder particles 135 and the resin 131 may be removed to expose the bumps 120.

FIGS. 8 through 11 are sectional views illustrating a method of forming a bump, according to still other example embodiments of the inventive concept. For the sake of brevity, again, the elements and features of this example that are similar to those previously shown and described will not be described in much further detail.

Figure 8:
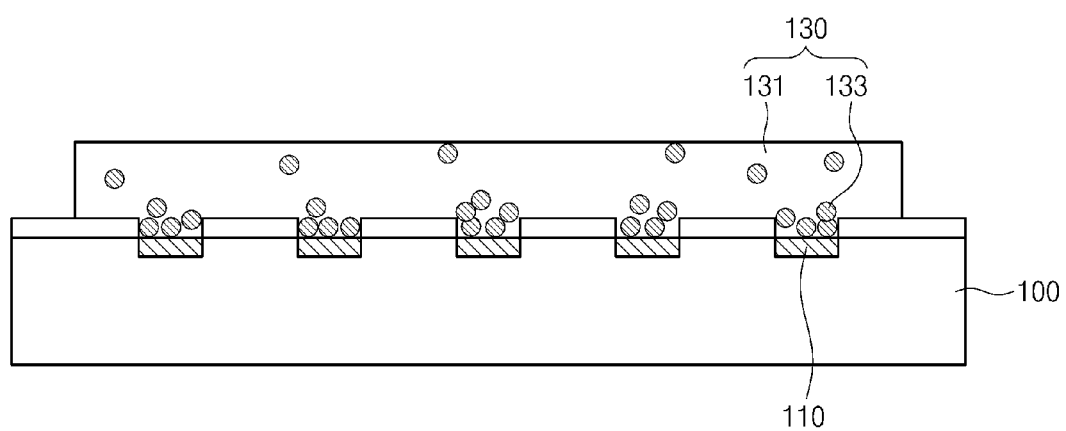
FIGS. 8 through 11 are sectional views illustrating a method of forming a bump, according to still other example embodiments of the inventive concept.

Referring to FIG. 8, the package substrate 100 formed with the SBM layer 130 may be provided. For example, as exemplarily described with reference to FIG. 2, the SBM layer 130 may be formed by attaching a film-shaped solder bump maker material on the package substrate 110. Alternatively, as exemplarily described with reference to FIG. 5, the SBM layer 130 may be formed using a paste-like solder but maker. The SBM layer 130 may be thermally treated to aggregate the solder particles 133 on the substrate pads 110. The thermal treatment on the SBM layer 130 may be performed at a temperature lower than or equivalent to a melting point of the solder particles 133. For example, if the solder particles 133 contain $Sn_3Ag_{0.5}Cu$, the thermal treatment may be performed at a temperature of about 215° C. or less. The temperature of the thermal treatment may be controlled by adjusting the kind and content of the reductant and/or an amount of oxygen to be supplied. For example, if a content of the reductant in the SBM layer 130 is decreased, the thermal treatment may be performed at a higher temperature. The reductant contained in the resin 131 may be used to remove an oxide layer from the solder particles 133 and the substrate pads 110. As the result of the removal of the oxide layer, surface tension may be exerted between the solder particles 133 and the substrate pads 110. Accordingly, the solder particles 133 adjacent to the substrate pads 110 may be moved toward the substrate pads 110 and be aggregated with the substrate pads 110 or the solder particles 133 adjacent thereto. In example embodiments, the number of the solder particles 133 aggregated to each other may be less than that of the solder particles constituting the bumps 120 that were previously described with reference to FIG. 3.

Figure 9:
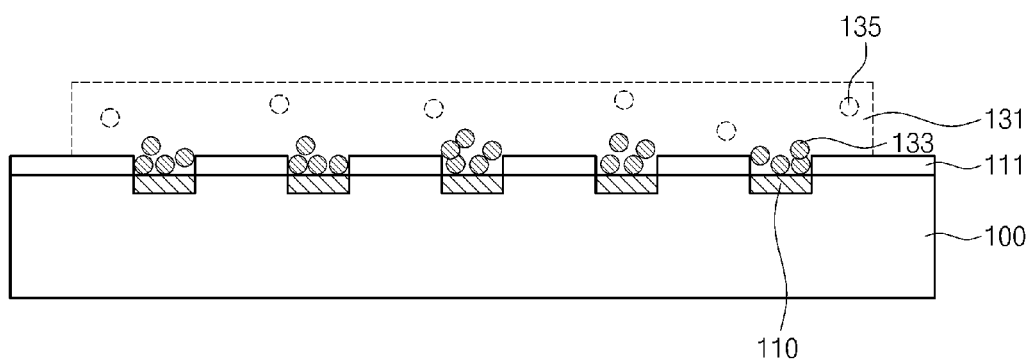

Referring to FIG. 9, the remaining solder particles 135 and the resin 131 may be removed to expose the aggregated solder particles 133. The remaining solder particles 135 and the resin 131 may be removed by a cleaning process. An oxide layer may be formed on surfaces of the exposed solder particles 133.

Figure 10:
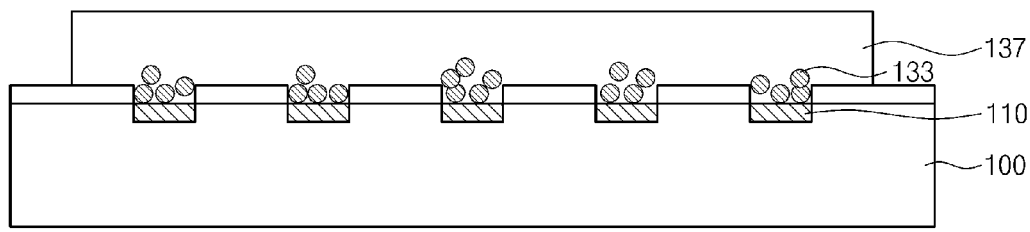

Referring to FIG. 10, a resin layer 137 may be formed to cover the exposed solder particles 133. The resin layer 137 may include at least one of resin materials previously described with reference to FIG. 2. The resin layer 137 may further include a reductant and thereby remove the oxide 1 from the surfaces of the solder particles 133.

Figure 11:
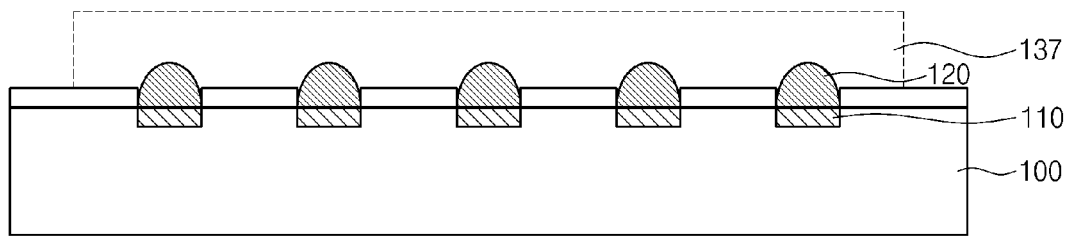

Referring to FIG. 11 in conjunction with FIG. 10, the solder particles 133 may be reflowed to form the bumps 120 on the substrate pads 110. The reflow of the solder particles 133 ay be performed at a temperature that is higher than a melting point of solder particles 133 and lower than a curing temperature of the resin layer 137. The bumps 120, which may be formed through the thermal treatment and the formation of the resin layer 137, may have a height of the bumps 120 that are fabricated without the thermal treatment and the formation of the resin layer 137, as described with reference to FIGS. 2 through 4. The resin layer 137 may be removed to finish the formation of the bumps 120.

Figure 12:
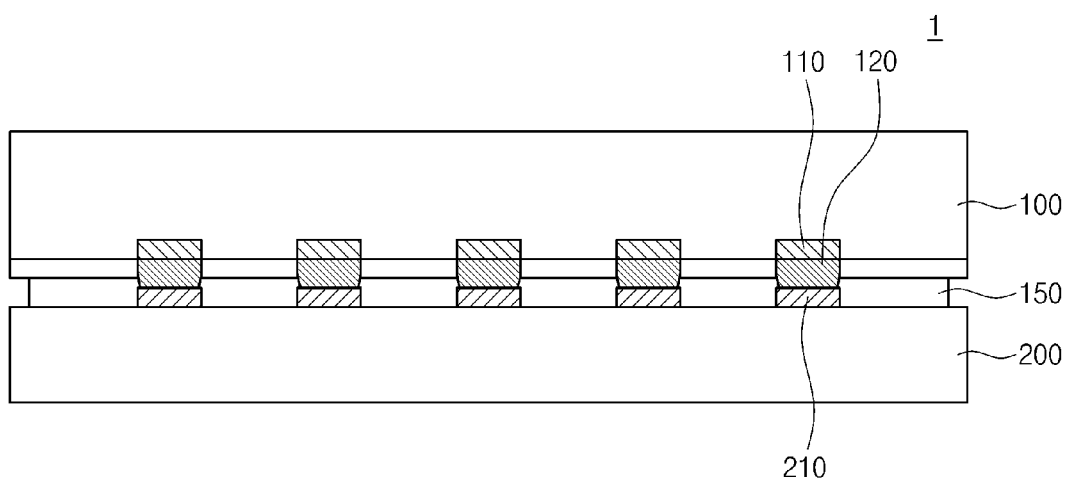
FIG. 12 is a sectional view illustrating a method of forming a semiconductor device, according to example embodiments of the inventive concept.

FIG. 12 is a sectional view illustrating a method of forming a semiconductor device, according to example embodiments of the inventive concept. For the sake of brevity, again, the elements and features of this example that are similar to those previously shown and described will not be described in much further detail.

Referring to FIG. 12, the device substrate 200 and the package substrate 100 may be provided. The device substrate 200 may be configured to have substantially the same features as examples of FIG. 1. The package substrate 100 may include the bumps 120 that are fabricated by one of the methods described with reference to FIGS. 2 through 4, FIGS. 5 through 7, and FIGS. 8 through 11. The package substrate 100 may be mounted on the device substrate 200 in a face-down manner or the bumps 120 face the device substrate 200. Accordingly, the bumps 120 may be connected to the pads 210 of the device substrate 200. Here, the under-filling layer 150 may be provided, in the form of paste or film, between the package substrate 100 and the device substrate 200. The under-filling layer 150 may include an epoxy resin and a filler (e.g., ceramics or aluminum nitride). The package substrate 100 and the device substrate 200 may be applied with heat, pressure, or ultrasonic wave to connect the package substrate 100 electrically to the device substrate 200. For example, the bumps 120 may be chemically connected to the pads 210 by heating the bumps 120 to a temperature of its melting point or higher. In other example embodiments, the bumps 120 may be mechanically connected to the pads 210, and during the mechanical connecting process, the bumps 120 may be heated to a temperature of its melting point or tower. Compared with the case that the package substrate 100 is electrically connected to the device substrate 200 through the solder particles, it is possible to improve connection stability between the bumps 120 and the pads 210 and to reduce contact resistance between the bumps 120 and the pads 210, when the package substrate 100 and the device substrate 200 are connected to each other through the bumps 120. The under-filling layer 150 may contribute to attach the bumps 120 to the pads 210 with increased stability. Further, the under-tilling layer 150 may remove an oxide layer from the bumps 120 and the pads 121, and this makes it possible to improve reliability of the semiconductor device 1.

Figure 13:
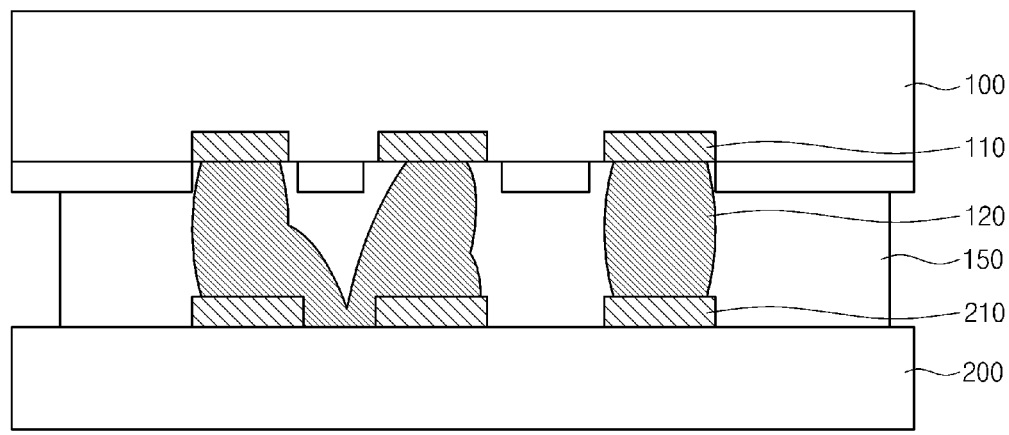
FIG. 13 is a sectional view showing an electric bridge, which may occur in a flip-chip bonding process.

FIG. 13 is a sectional view showing an electric bridge, which may occur in a flip-chip bonding process.

Referring to FIG. 13 in conjunction with FIG. 12, in the case where the bumps 120 have a large thickness, an electrical short circuit may be formed between the bumps 120, when the package substrate 100 is connected to the device substrate 200. According to example embodiments of the inventive concept, it is possible to control the height of the bumps 120 with ease. The bumps fabricated by the method described with reference to FIGS. 8 through 11 may have a thickness smaller than those by fabricated the method described with reference to FIGS. 2 through 4 or FIGS. 5 through 7. Accordingly, an electrical short circuit can be prevented from being formed between the bumps 120, and the semiconductor device 1 can be fabricated to have a small pitch and a high density I/O system.

According to example embodiments of the inventive concept, a device substrate may be electrically connected to a package substrate via bumps. In this case, it is possible to realize a more stable connection between the bumps and pads, compared with the case that the package and device substrates are connected to each other via solder particles. Accordingly, it is possible to reduce a contact resistance of the semiconductor device. Further, according to the forming methods of the inventive concept, it is possible to prevent a bridge from occurring between the bumps, and thus, this makes it possible to realize semiconductor devices with a small pattern pitch. According to example embodiments of the inventive concept, the bumps may be configured to have a small thickness, and this makes it possible to prevent an electric short circuit from occurring between the bumps in a mounting process and to realize a high density I/O system. The bumps and the semiconductor device may be used to realize a display panel with a small bezel.

While example embodiments of the inventive concepts have been particularly shown and described, it will be understood by one of ordinary skill in the art that variations in form and detail may be made therein without departing from the spirit and scope of the attached claims.

What is claimed is:

1. A method of forming a semiconductor device, comprising:
    providing a package substrate with pads;
    forming a solder bump maker layer on the package substrate, the solder bump maker layer covering the pads and including a resin and solder particles;
    reflowing the solder particles to form bumps on the pads; and
    connecting the bumps to a device substrate to couple the package substrate electrically to the device substrate,
    wherein the reflowing of the solder particles comprises:
        thermally treating the solder bump maker layer to aggregate the solder particles adjacent to the pads onto the pads;
        removing the resin to expose the aggregated solder particles;
        forming a resin layer to cover the solder particles;
        thermally treating the solder particles to form the bumps on the pads; and
        removing the resin layer to expose the bumps.

2. The method of claim 1, wherein the thermally treating of the solder bump maker layer is performed at a temperature that is equivalent to or lower than a melting point of the solder particles.

3. The method of claim 1, wherein the reflowing of the solder particles comprises a thermal treatment performed at a temperature that is higher than a melting point of the solder particles and lower than a curing temperature of the resin.

4. The method of claim 1, wherein the forming of the solder bump maker layer comprises:
    forming a guide layer on the package substrate to expose the pads;
    coating a solder bump maker on the exposed pads to form the solder bump maker layer;
    thinning the solder bump maker layer; and
    removing the guide layer.

5. The method of claim 1, wherein the forming of the solder bump maker layer comprises attaching a film including the resin and the solder particles on the package substrate.

6. The method of claim 1, wherein the reflowing of the solder particles comprises removing the solder bump maker layer to expose the bumps.

7. A method of forming a bump, comprising:
    providing a substrate with pads;
    forming a bump maker layer on the substrate to cover the pads and include a resin and solder particles;
    performing a first thermal treatment to the bump maker layer to aggregate the solder particles on the pads;
    removing the resin to expose the aggregated solder particles;
    forming a resin layer to cover the aggregated solder particles; and
    performing a second thermal treatment to the bump maker layer to form bumps on the pads.

8. The method of claim 7, wherein the first thermal treatment of the bump maker layer is performed at a temperature that is lower than a melting point of the solder particles.

9. The method of claim 7, wherein the second thermal treatment of the bump maker layer comprises reflowing the solder particles at a temperature that is higher than a melting point of the solder particles and lower than a curing temperature of the resin.

10. The method of claim 7, wherein the forming of the bump maker layer comprises attaching a film-shaped solder bump maker material on the substrate.

11. The method of claim 7, wherein the forming of the bump maker layer comprises coating the substrate with a paste-like solder bump maker material.

12. The method of claim 7, wherein the forming of the bump maker layer comprises preparing a solder bump maker material that is formed by adding the solder particles into the resin under nitrogen ambient.

13. The method of claim 7, wherein the resin further comprises a reductant.

14. The method of claim 7, wherein the solder particles are formed to have a mean diameter ranging from $1/10000$ to $1/3$ of that of the pads.

* * * * *